US012660860B2

(12) United States Patent
Parry et al.

(10) Patent No.: US 12,660,860 B2
(45) Date of Patent: Jun. 23, 2026

(54) HEATING SYSTEM FOR AN AEROSOL GENERATION ASSEMBLY AND ASSOCIATED AEROSOL GENERATION ASSEMBLY

(71) Applicant: JT International S.A., Geneva (CH)

(72) Inventors: John Parry, Watford (GB); Daniel Vanko, Krpelany (SK); Branislav Zigmund, Vrbovce (SK)

(73) Assignee: JT International S.A., Geneva (CH)

( * ) Notice: Subject to any disclaimer, the term of this patent is extended or adjusted under 35 U.S.C. 154(b) by 426 days.

(21) Appl. No.: 18/275,535

(22) PCT Filed: Feb. 4, 2022

(86) PCT No.: PCT/EP2022/052663
§ 371 (c)(1),
(2) Date: Aug. 2, 2023

(87) PCT Pub. No.: WO2022/167559
PCT Pub. Date: Aug. 11, 2022

(65) Prior Publication Data
US 2024/0122267 A1 Apr. 18, 2024

(30) Foreign Application Priority Data

Feb. 5, 2021 (EP) ..................................... 21155456

(51) Int. Cl.
*A24F 40/57* (2020.01)
*A24F 40/465* (2020.01)
(Continued)

(52) U.S. Cl.
CPC ............ *A24F 40/57* (2020.01); *A24F 40/465* (2020.01); *H03B 5/24* (2013.01); *H05B 1/0202* (2013.01); *H05B 6/108* (2013.01)

(58) Field of Classification Search
CPC ........ A24F 40/465; A24F 40/50; A24F 40/57; A24F 40/42; H03B 5/24; H05B 1/0202; H05B 6/108; H05B 6/04; H05B 6/105
(Continued)

(56) References Cited

U.S. PATENT DOCUMENTS

2014/0270727 A1 9/2014 Ampolini et al.
2016/0366947 A1 12/2016 Monsees et al.
(Continued)

FOREIGN PATENT DOCUMENTS

EP 2991516 A1 3/2016
WO 2015177046 A1 11/2015

OTHER PUBLICATIONS

International Search Report for PCT/EP2022/052663 mailed Jun. 1, 2022. 4 pgs.

*Primary Examiner* — Quang T Van
(74) *Attorney, Agent, or Firm* — Lerner David LLP

(57) ABSTRACT

A heating system for an aerosol generation assembly, includes a coil, a susceptor and an oscillation circuitry configured to generate AC current on the coil from a DC current provided by the battery. The oscillation circuitry comprises includes at least one power circuit including two power transistors (Q1A, Q1B) and a bias line (LA, LB) for each power transistor (Q1A, Q1B). Each power transistor (Q1A, Q1B) includes a gate terminal connected to the corresponding bias line (LA, LB) and able to control the current between the corresponding source and drain terminals. The oscillation circuitry further includes a microcontroller connected to both bias lines (LA, LB) and able to generate a voltage signal on each of the bias lines (LA, LB). The at least one power circuit further includes a potential divider defining an output terminal (T) connected to the microcontroller.

15 Claims, 6 Drawing Sheets

(51) Int. Cl.
    *H03B 5/24*           (2006.01)
    *H05B 1/02*           (2006.01)
    *H05B 6/10*           (2006.01)

(58) Field of Classification Search
    USPC ....... 219/661, 628, 618, 634, 635, 667, 490,
               219/494, 385, 510, 552, 534, 542, 553;
                      392/395, 397, 400, 404
    See application file for complete search history.

(56)                References Cited

U.S. PATENT DOCUMENTS

| | | |
|---|---|---|
| 2017/0112191 A1 | 4/2017 | Sur et al. |
| 2020/0352229 A1* | 11/2020 | Lee ......................... A24F 40/46 |
| 2020/0352249 A1* | 11/2020 | Achtien ............ A61M 15/0066 |

* cited by examiner

HEATING SYSTEM FOR AN AEROSOL GENERATION ASSEMBLY AND ASSOCIATED AEROSOL GENERATION ASSEMBLY

CROSS-REFERENCE TO RELATED APPLICATIONS

The present application is a national phase entry under 35 U.S.C. § 371 of International Application No. PCT/EP2022/052663, filed Feb. 4, 2022, published in English, which claims priority to European Application No. 21155456.3 filed Feb. 5, 2021, the disclosures of which are incorporated herein by reference in their entireties.

FIELD OF THE INVENTION

The present invention concerns a heating system for an aerosol generation assembly.

The present invention also concerns an aerosol generation assembly associated to such a heating system. The aerosol generation assembly may for example comprise an aerosol generation device and a cartridge.

BACKGROUND OF THE INVENTION

Different types of aerosol generation devices are already known in the art. Generally, such devices comprise a storage portion for storing a vaporizable material, which can comprise for example a liquid or a solid. A heating system is formed of one or more electrically activated resistive heating elements arranged to heat said vaporizable material to generate the aerosol. The aerosol is released into a flow path extending between an inlet and outlet of the device. The outlet may be arranged as a mouthpiece, through which a user inhales for delivery of the aerosol.

In some aerosol generation devices, the vaporizable material is stored in a removable cartridge. Thus, when the vaporizable material is consumed, the cartridge can be easily removed and replaced. In order to attach the removable cartridge to the device body, a screw-threaded connection can for example be used.

Different types of heating systems can be used to heat the vaporizable material in such devices. For example, in case of a liquid vaporizable material, a heating system may be formed by a resistance arranged in the flow path and wound around a wick in communication with the liquid vaporizable material. Thus, carried by the wick, the vaporizable material can be evaporated by the resistance arranged in the flow path. According to another example, a heating system comprises a heating plate in direct contact with the vaporizable material which can be for example a solid vaporizable material. Thus, the plate can heat the vaporizable material to form vapour.

According to another example of a heating system, the vaporizable material can be heated by a susceptor element arranged in contact with the vaporizable material. This susceptor element is magnetically coupled with a coil connected to the battery of the device and thus, is able to heat the vaporizable material by induction heating. The source of the generated heat are magnetic hysteresis loss and/or eddy-current loss mechanisms. In this case, the coil is connected to the battery through a self-oscillating circuit making it possible to generate an alternative current on the coil. A controller is usually provided to control this current and as a consequence, the temperature of the vaporizable material. This last type of heating systems is generally used with solid vaporisable materials and the aerosol generation device integrating such a system is known as "heat not burn" device. Indeed, these heating systems should be able to heat the vaporizable material without burning it. Additionally, in order to provide a better user experience, the vaporizable material can be heated according to a predefined heating profile.

One can thus conceive that an accurate temperature control is crucial for an aerosol generation device. In the art, some heating systems integrating a self-oscillating circuit are not able to provide such a control. The vaporizable material can for example be heated too slowly or on the contrary, too fast. This can burn the vaporizable material and/or provide a poor user experience. Other heating systems may represent a complex structure that increases the device's cost and may affect its design.

SUMMARY OF THE INVENTION

One of the aims if the present invention is to propose a heating system with an integrated self-oscillating circuit which is able to provide an accurate temperature control of the vaporizable material without increasing the cost or affecting the design of the aerosol generation device.

For this purpose, the invention relates to a heating system for an aerosol generation 30 assembly comprising a battery for providing DC current and a storage portion for storing a vaporizable material, the battery comprising a first battery terminal and a second battery terminal.

The heating system comprises:
- a coil arranged in vicinity of the storage portion and connected to the first battery terminal;
- a susceptor arranged in the storage portion;
- an oscillation circuitry configured to generate AC current on the coil from the DC current provided by the battery the susceptor being able to heat the vaporizable material further to magnetic interaction with the coil;

wherein:
- the oscillation circuitry comprises at least one power circuit, the at least one power circuit comprising two power transistors and a bias line for each power transistor;
- each power transistor comprises a source and a drain terminals connecting the coil to the second battery terminal, and a gate terminal connected to the corresponding bias line and able to control the current between the corresponding source and drain terminals according to the voltage on its gate terminal;
- the oscillation circuitry further comprises a microcontroller connected to both bias lines and able to generate a voltage signal on each of the bias lines;
- the at least one power circuit further comprises a potential divider defining an output terminal connected to the microcontroller, the microcontroller being able to verify the operation of the oscillation circuitry by analysing the voltage on the output terminal.

Thanks to these features, the microcontroller can be efficiently used to switch between ON and OFF state (ON and OFF do not mean only start and/or stop states, as it also means something in the between to control the power to the heater). The microcontroller can stop and start the system either by the command of the user and/or either when it detects some irregularity during the system's operation. The microcontroller can also ensure an optimal profile of alternative current on the coil and thus allow precise average power flow control from the self-oscillating circuit to the heater. Hence, ensure an accurate temperature control.

Additionally, the potential divider added to the oscillation circuitry allows a frequency analysis and an easy way to verify if the circuitry has correctly started operation and is not held in stable short conditions. This makes it possible to monitor the operation of the oscillation circuitry and prevent its damaging.

The components used by the oscillation circuitry do not render the structure of the system complex and consequently, do not increase its cost and does not affect the assembly design.

According to some embodiments, each bias line comprises a bias resistor.

Thanks to these features, it is possible dimension the resistors so as to ensure optimal switching points of the power transistors. Thus, the switching carried out by the transistor is efficient.

According to some embodiments, the oscillation circuitry further comprises a capacitor connected in parallel with the coil and comprising two capacitor terminals.

According to some embodiments, the at least one power circuit further comprises two connection lines connecting the capacitor terminals to the second battery terminal and for each connection line, a bypass line connecting the gate terminal of one of the power transistors to the corresponding connection line.

According to some embodiments, each connection line comprises a diode and a preventing resistor connected in series between the corresponding bypass line and the corresponding capacitor terminal to prevent negative voltage excursions on this power transistor.

Thanks to these features, it is possible to avoid negative voltage excursions which can turn off one of the transistors in an uncontrolled manner. Additionally, the features makes it possible to reduce the risk of too high gate-to-source voltage on the transistors, which could lead to irreversible damages. Finally, it is possible to dimension the preventing resistors so as to further optimize the switching process.

According to some embodiments, the potential divider is integrated into one of the connection lines between the second battery terminal and the corresponding bypass line.

These features make it possible to monitor the status of the system by helping to bring the voltage down so that the microcontroller can process it. This allows to read the voltage that corresponds to the switching status of the system.

According to some embodiments, the connection line without the potential divider further comprises a load resistor connected between the corresponding bypass line and the second battery terminal.

Thanks to these features, it is possible to optimize the operation of the divider.

According to some embodiments, the at least one power circuit further comprises for each power transistor, a capacitor connected between a pair of terminals of the corresponding power transistor.

According to some embodiments, said pair of terminals are source and gate terminals.

Thanks to these features, it is possible to use of a wide range of transistors in the power circuit and make it behave consistently in the oscillation circuitry. Thus, it is possible to optimize the switching process carried out by the transistors. Indeed, as it is known per se, the transistors present generally parasitic capacitances between their terminals. These capacitances are difficult to avoid or prevent. So, disposing a real capacitor between a pair of terminals makes it possible to provide a known response and some protection against the parasitic capacitances.

According to some embodiments, the coil is powered by a sinusoidal signal.

Thanks to these features, the heat generated by the susceptor can be accurately controlled.

According to some embodiments, the coil is arranged around the storage portion.

Thanks to these features, the energy from the coil can be efficiently transferred to the susceptor.

According to some embodiments, the heating system comprises a burst reservoir connected to the battery in parallel with the oscillation circuitry and comprising at least two capacitors connected in parallel.

Thanks to these features, it is possible to protect the battery against high voltage drops which may occur at the beginning of a vaping session where very high currents are needed. Additionally, it makes it possible to provide current to the circuitry very fast. This is not always possible using only a battery since its response time is not always fast as needed.

The invention also concerns an aerosol generation assembly comprising a heating system as explained above.

According to some embodiments, the aerosol generation assembly further comprises an aerosol generation device and a cartridge, the battery being arranged in the aerosol generation device and the storage portion being arranged in the cartridge.

According to some embodiments, the coil and the oscillation circuitry are arranged in the aerosol generation device.

Thanks to these features, it is possible to arrange the heating system within an assembly comprising a removable cartridge.

BRIEF DESCRIPTION OF THE DRAWINGS

The invention and its advantages will be better understood upon reading the following description, which is given solely by way of non-limiting example and which is made with reference to the appended drawings, in which.

DETAILED DESCRIPTION OF THE INVENTION

Figure 1:
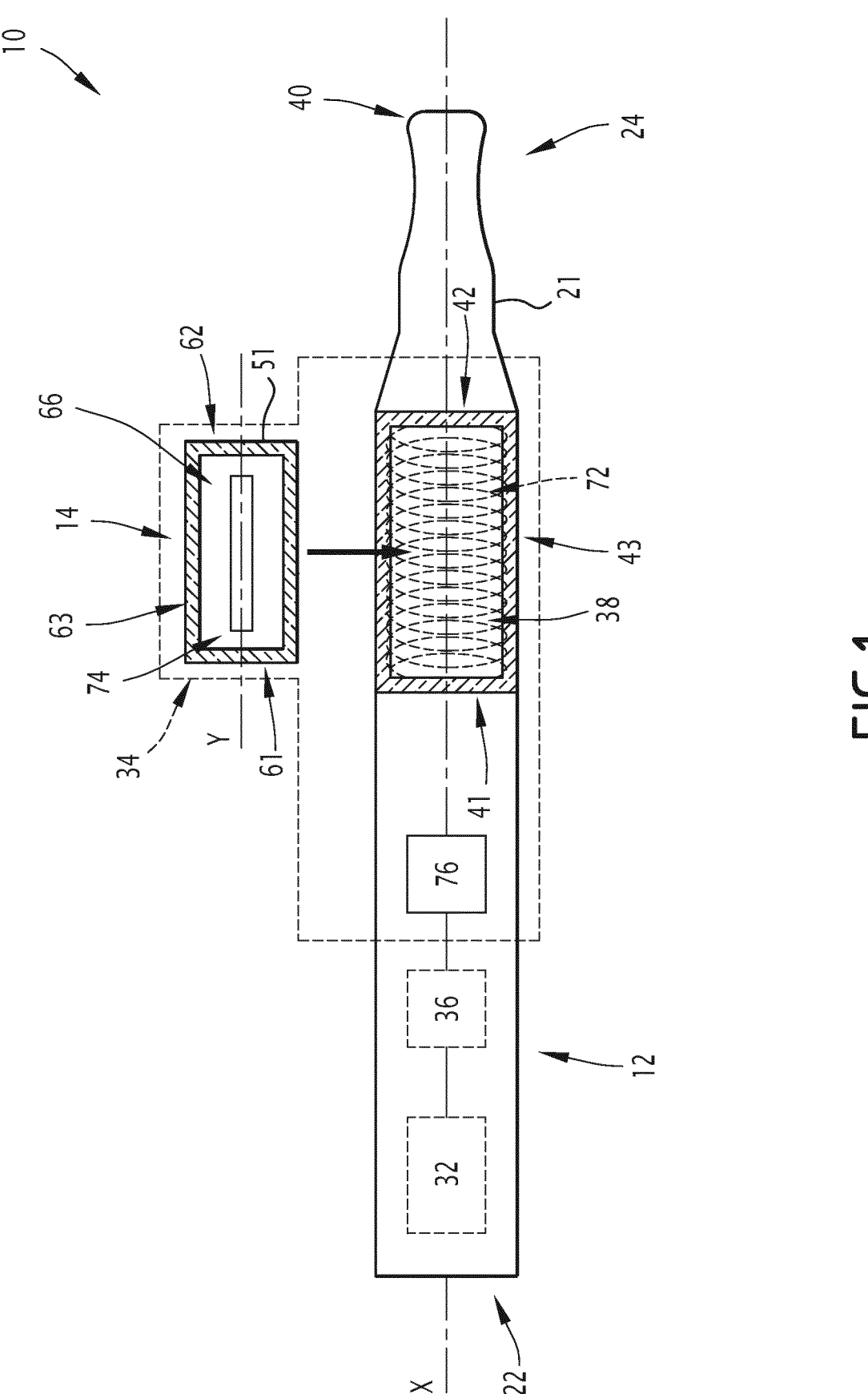
FIG. 1 is a schematic diagram showing an aerosol generation assembly according to the invention, the aerosol generation assembly comprising a heating system according to the invention.

Before describing the invention, it is to be understood that it is not limited to the details of construction set forth in the following description. It will be apparent to those skilled in the art having the benefit of the present disclosure that the invention is capable of other embodiments and of being practiced or being carried out in various ways.

As used herein, the term "aerosol generation device" or "device" may include a vaping device to deliver an aerosol to a user, including an aerosol for vaping, by means of aerosol generating unit (e.g. an aerosol generating element which generates vapor which condenses into an aerosol before delivery to an outlet of the device at, for example, a mouthpiece, for inhalation by a user). The device may be portable. "Portable" may refer to the device being for use when held by a user. The device may be adapted to generate a variable amount of aerosol, e.g. by activating a heater system for a variable amount of time (as opposed to a metered dose of aerosol), which can be controlled by a trigger. The trigger may be user activated, such as a vaping button and/or inhalation sensor. The inhalation sensor may be sensitive to the strength of inhalation as well as the duration of inhalation to enable a variable amount of vapor to be provided (so as to mimic the effect of smoking a conventional combustible smoking article such as a cigarette, cigar or pipe, etc.). The device may include a temperature regulation control to drive the temperature of the heater and/or the heated aerosol generating substance (aerosol pre-cursor) to a specified target temperature and thereafter to maintain the temperature at the target temperature that enables efficient generation of aerosol.

As used herein, the term "aerosol" may include a suspension of vaporizable material as one or more of: solid particles; liquid droplets; gas. Said suspension may be in a gas including air. Aerosol herein may generally refer to/include a vapor. Aerosol may include one or more components of the vaporizable material.

As used herein, the term "vaporizable material" or "precursor" or "aerosol forming substance" or "substance" is used to designate any material that is vaporizable in air to form aerosol. Vaporization is generally obtained by a temperature increase up to the boiling point of the vaporization material, such as at a temperature less than 400° C., preferably up to 350° C. The vaporizable material may, for example, comprise or consist of an aerosol-generating liquid, gel, wax, foam or the like, an aerosol-generating solid that may be in the form of a rod, which contains processed tobacco material, a crimped sheet or oriented strips of reconstituted tobacco (RTB), or any combination of these. The vaporizable material may comprise one or more of: nicotine, caffeine or other active components. The active component may be carried with a carrier, which may be a liquid. The carrier may include propylene glycol or glycerin. A flavoring may also be present. The flavoring may include Ethylvanillin (vanilla), menthol, Isoamyl acetate (banana oil) or similar.

Referring to FIG. 1, an aerosol generation assembly 10 according to the invention comprises an aerosol generation device 12 and a cartridge 14 configured to store a vaporizable material. In the example of this FIG. 1, the cartridge 14 is removable cartridge which can be inserted in a payload compartment of the aerosol generation device 12 as it will be explained in detail below. In this case, the cartridge 14 can be for example replaced or refilled when the vaporizable material is exhausted. According to another embodiment (non-shown), the cartridge may be formed by the payload compartment of the aerosol generation device. Thus, when the vaporizable material is exhausted, the cartridge can be refilled.

As shown on FIG. 1, the aerosol generation device 12 comprises a device housing 21 extending between a battery end 22 and a mouthpiece end 24 along a device axis X.

The device housing 21 delimits an interior part of the aerosol generation device 12 comprising a power block 32 designed to power the device 12, at least a part of a heating system 34 powered by the power block 32, and a controller 36. The device housing 21 also defines a payload compartment 38 which may be arranged in the interior part of the device 12 or/and defined at least partially by at least one wall of the device housing 21. Additionally, in the example of FIG. 1, on the mouthpiece end 24, the device housing 21 defines a mouthpiece 40. The mouthpiece 40 is in a fluid communication with the payload compartment 38 and defines an airflow outlet configured to deliver aerosol to the user when the aerosol generation device 12 is operated with the cartridge 14. According to another embodiment, the mouthpiece 40 can be integrated into the cartridge 14. The device housing 21 may further comprise other internal components performing different functionalities of the device 12 known in the art.

It should be noted that FIG. 1 presents only a schematic diagram of different components of the aerosol generation device 12 and does not necessarily show the real physical arrangement and dimensions of these components. Particularly, such an arrangement can be chosen according to the design of the aerosol generation device 12 and technical features of its components.

The power block 32 comprises a battery 32B (shown on FIG. 2) and a battery charger. The battery 32B is for example a known battery designed to be charged using the power supply furnished by an external source and to provide a direct current DC of a predetermined voltage. The battery 32B defines a first battery terminal which is for example a positive voltage terminal $V^+$, and a second battery terminal which if for example a negative voltage terminal $V^-$. The battery charger is able to connect the battery to the external source and comprises for this purpose a power connector (like for example a mini-USB connector) or wireless charging connector. The battery charger is also able to control the power delivered from the external source to the battery according for example a predetermined charging profile. Such a charging profile can for example define a charging voltage of the battery depending on its level of charge.

The controller 36 is able to control the operation of the aerosol generation device 12. Particularly, the controller 36 is configured to power the heating system 34 from the power block 32 to generate vapour from the vaporizable material. The controller 36 can be actuated by the user via a vaping button or further to a trigger event as for example detection of a user puff. The controller 36 may perform any other additional functionality of the device 12 known per se. Such a functionality may for example concern a communication capacity of the device 12 with an external device, a maintenance capacity, an analysis capacity, etc.

The payload compartment 38 defines a cavity designed to receive the cartridge 14. In the preferred embodiment of the invention, the cavity has a cylindrical shape. In the example of FIG. 1, the payload compartment 38 extends along the device axis X between a pair of parallel walls 41, 42 of the device housing 21. In the same example, the payload compartment 38 is further delimited by at least one side wall 43 extending 30 between the parallel walls 41, 42 along the device axis X. In this case, the payload compartment 38 may further define an opening used to insert the cartridge 14 into the payload compartment 38. The opening may for example extend perpendicularly to the device axis X and is formed when a removable part of the device housing 21 is moved away from a fixed part of the device housing 21 including notably the payload 35 compartment 38. The removable part can for example comprise the mouthpiece 24 and the wall 42. The removable part can be hinged or screwed to the fixed part. In the embodiment where the mouthpiece 40 is integrated into the cartridge 14, the opening to the payload compartment 38 can for example extend perpendicularly to the device axis X at the mouthpiece end 24 of the device 10.

In this case, the cartridge 14 can be inserted into the payload compartment 38 following the device axis X. In the embodiment where the cartridge 14 is formed by the payload compartment 38, the opening of the payload compartment 38 can be used for refilling it with the vaporizable material.

Each of the parallel walls 41, 42 is for example perpendicular to the device axis X. The wall 41 is adjacent to the battery end 22 and defines a hole suitable for an airflow passage between an airflow channel formed inside the device housing 21 and the cartridge 14. The wall 42 is adjacent to the mouthpiece end 24 and defines a hole suitable for an airflow passage between the cartridge 14 and the airflow outlet of the mouthpiece 40.

As shown on FIG. 1, the cartridge 14 comprises a cartridge housing 51 and the part of the heating system 34 which is not comprised in the aerosol generation device 12, as it will be explained below in further detail. The cartridge housing 51 extends along a cartridge axis Y between a device end and a mouthpiece end, and defines at these ends two parallel walls 61, 62 perpendicular to the cartridge axis Y and at least one lateral wall 63 extending along the cartridge axis Y between the parallel walls 61, 62. In the preferred embodiment of the invention, the cartridge housing 51 has a cylindrical shape. In this case, the parallel walls 61, 62 can have a circular shape. The walls 61, 62, 63 of the cartridge housing 51 are made of a dielectric material like for example a plastic material. Advantageously, according to the invention, the walls 61, 62, 63 can form a single piece made by an appropriate industrial process. The walls 61, 62, 63 of the cartridge housing 51 delimit a storage portion 66 configured to store the aerosol forming precursor.

In the example of FIG. 1, when the cartridge 14 is received into the payload compartment 38 of the aerosol generation device 12, the cartridge axis Y coincides with the device axis X and the parallel walls 61, 62 of the cartridge housing 51 are in contact with the parallel walls 41, 42 of the payload compartment 38. Particularly, in this case, the wall 61 is in contact with the wall 41 and defines an airflow inlet facing the corresponding hole of the wall 41 to allow entering the airflow into in the cartridge 14. Similarly, the wall 62 is in contact with the wall 42 and defines an airflow outlet facing the corresponding hole of the wall 42 to allow evacuating the airflow from the cartridge 14.

Figure 2:
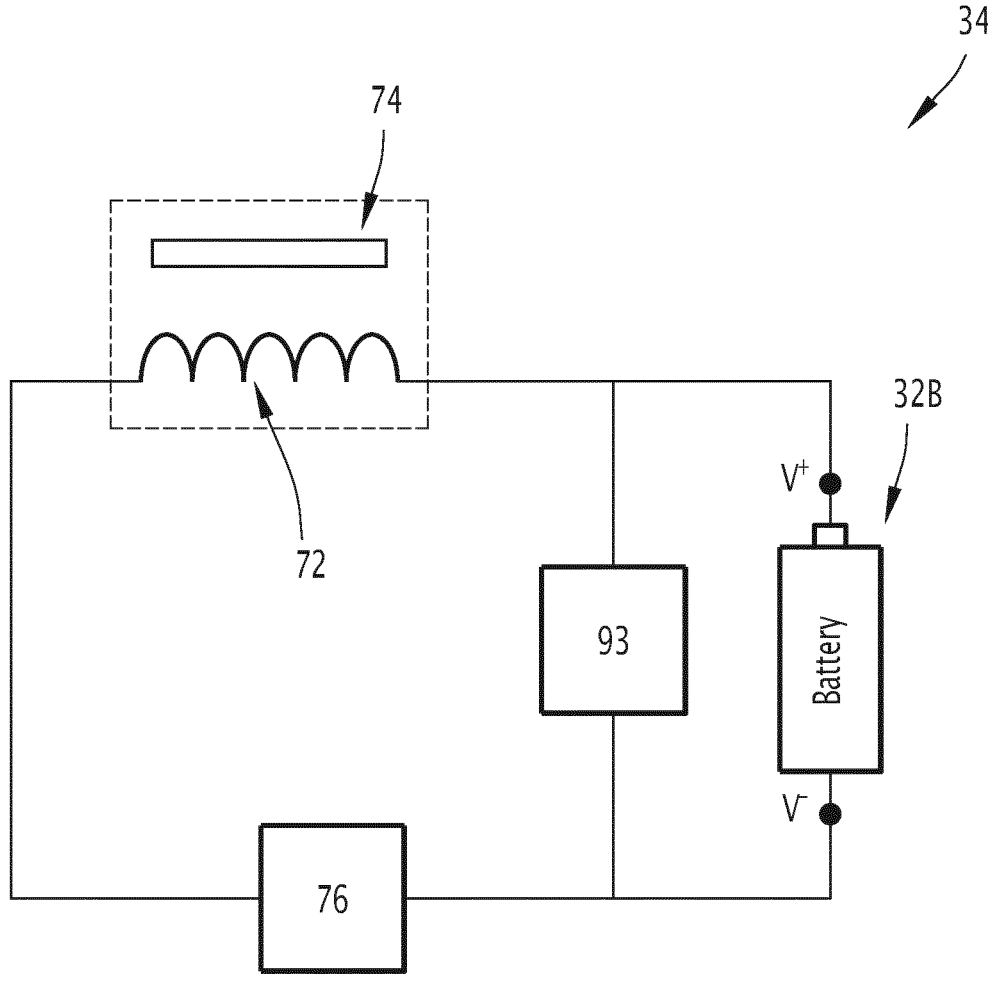
FIG. 2 is a schematic diagram showing the heating system of FIG. 1, the heating system comprising an oscillation circuitry.

FIG. 2 shows in more detail the heating system 34. Referring to this FIG. 2, the heating system 34 comprises a coil 72 arranged in vicinity of the storage portion 66, when the cartridge 14 is received in the payload compartment 38, a susceptor 74 arranged in the storage portion 66 and an oscillation circuitry 76 configured to generate AC current on the coil 72 from the DC current provided by the battery 32B.

The coil 72 and the susceptor 74 are arranged respectfully so as to the susceptor 74 is able to heat the vaporizable material further to magnetic interaction with the coil 72. A particular example of such an arrangement is shown on FIG. 3.

Figure 3:
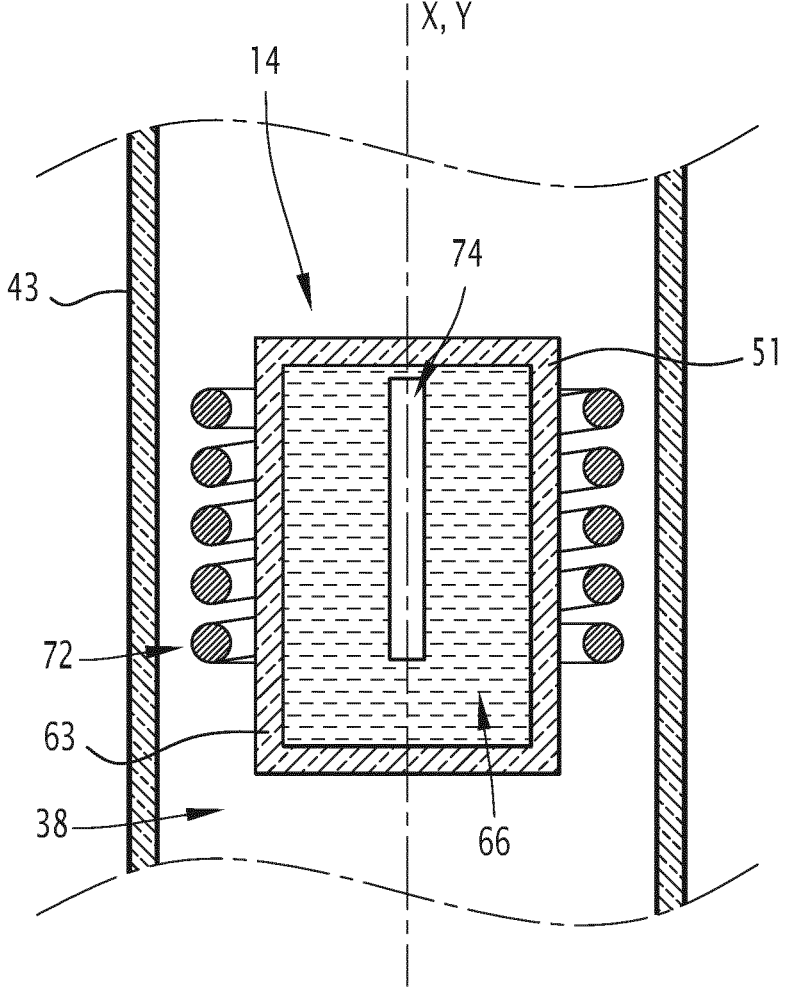
FIG. 3 is a detailed view of an exemplary arrangement of the heating system of FIG. 1.

Referring to this FIG. 3, the coil 72, also visible on FIG. 1 on dashed line, is intended to be arranged around the storage portion 66 of the cartridge 14 along the cartridge axis Y when the cartridge 14 is received in the payload compartment 38. Particularly, in the example of FIGS. 1 and 3, the coil 72 is intended to extend around the lateral wall 63 of the cartridge housing 51, and preferably, significantly along the whole length of the lateral wall 63. For this purpose, the coil 72 is integrated into the side wall 43 of the payload compartment 38 or protrudes from this side wall 43 to extend around the payload compartment 38 along the device axis X. Thus, the coil 72 is integrated into the device 12 and when the cartridge 14 is received in the payload compartment 38, the coil 72 extends around the lateral wall 63 of the cartridge housing 51 and consequently, around the storage portion 66 of the cartridge 14.

The susceptor 74 is arranged in the storage portion 66 of the cartridge 14, preferably along the cartridge axis Y. The susceptor 74 is made of a conductive material, for example a metallic material such as aluminium or aluminium alloys, or ferromagnetic material such as mild-steel. The shape and the dimensions of the susceptor 74 are chosen so as to optimize the magnetic coupling and consequently the energy transfer efficiency with the coil 72. The shape and the dimensions of the susceptor 74 are also chosen depending on the cartridge's format. According to the example of FIG. 3, the susceptor 74 has a parallelepiped shape extending along the cartridge axis Y. According to another example, the susceptor 74 has a thin tube shape also extending along the cartridge axis Y. For example, the tube can define a wall thickness comprised between 30 μm and 150 μm, and for example substantially equal to 50 μm. A greater wall thickness can be chosen to simplify the manufacturing process. According to both examples, the length of susceptor 74 can be chosen between 5 mm and 13 mm, advantageously between 7 mm and 11 mm. In general case, the shape of the susceptor 74 is chosen so as to concentrate better the electromagnetic field created by the coil 72. For example, for the coil 72 having a round shape where the strength of the field is the lowest in the geometric center, the shape of the susceptor 74 is chosen so as to be closer to the windings of the coil 72. According to some embodiments, the susceptor 74 can be made from several separate elements having substantially the same shape and dimensions or different shapes and/or dimensions.

Figure 4:
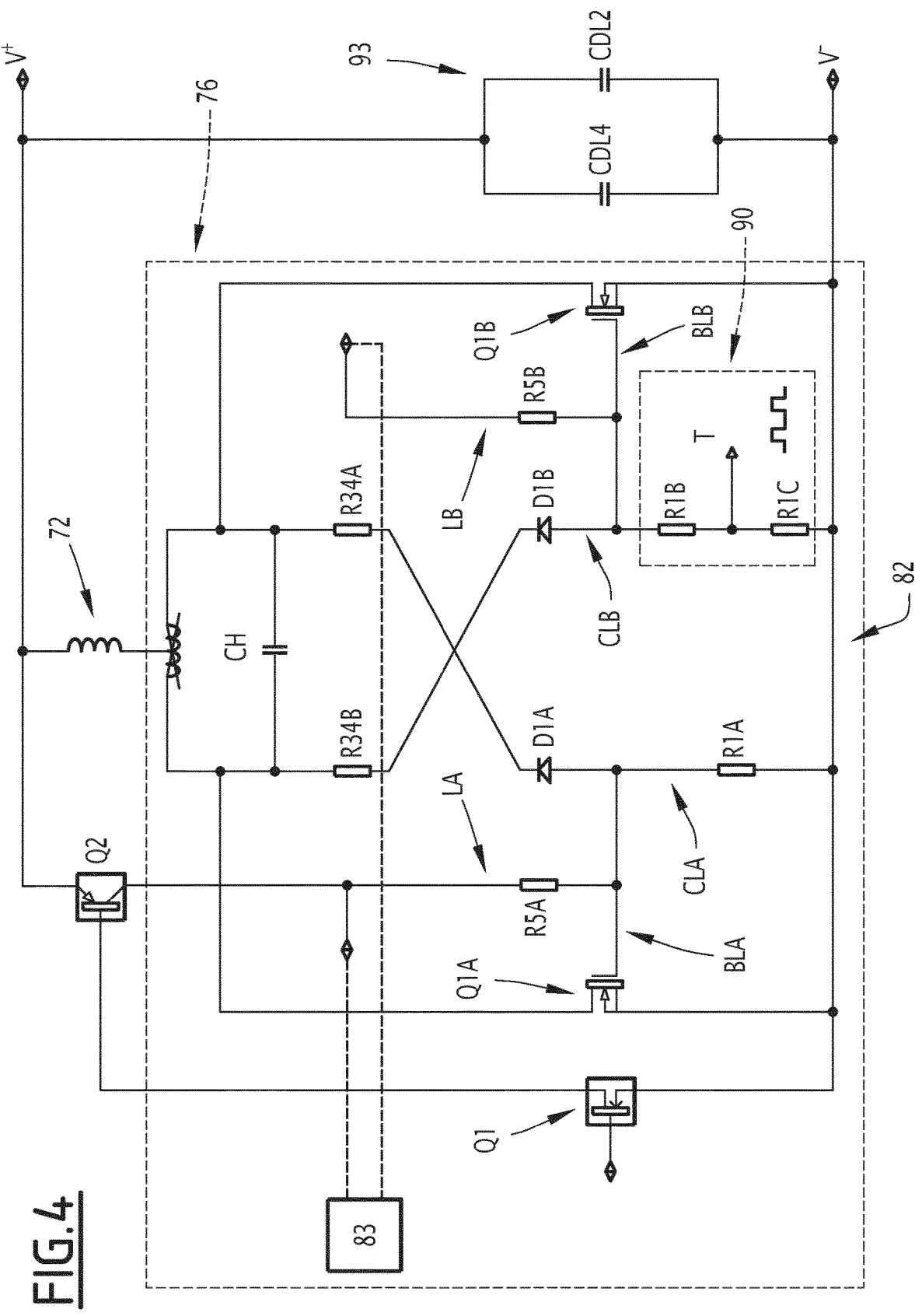
FIG. 4 is an electrical scheme of the oscillation circuitry of FIG. 2.

An electrical scheme of the oscillation circuitry 76 is shown on FIG. 4. Referring to this FIG. 4, the oscillation circuitry 76 comprises at least one power circuit 82 and a microcontroller 83 able to control the operation of the power circuit 82. The oscillation circuitry 76 may further comprise a switch connecting the circuitry 76 to the battery 32B and controlled for example by the controller 36 or the microcontroller 83. This switch may be formed by a transistor Q1 shown on FIG. 4.

The microcontroller 83 is able to monitor the operation of the oscillation circuitry 76 by analysing the signal provided by a potential divider explained in further detail below. The microcontroller 83 is also able to improve the switching performance of the oscillation circuitry 76 (make switching well synchronized to obtain "clean" sinusoidal signal). For this purpose, the microcontroller 83 is able to add or remove a small quantity of voltage on bias lines connected to the microcontroller 83 and explained in further detail below. In other words, the microcontroller 83 is able to generate a voltage signal on each of the bias lines to optimize the switching process carried out by the oscillation circuitry 76

The power circuit 82 comprises two power transistors Q1A, Q1B and for each power transistor Q1A, Q1B, a bias line LA, LB connected to the microcontroller 83. Each power transistor Q1A, Q1B is for example a MOSFET transistor which comprises a source and a drain terminals connecting the coil 72 to the second battery terminal V⁻, and a gate terminal connected to the corresponding bias line LA, LB. The gate terminal is able to control the current between the corresponding source and drain terminals according to the voltage imposed on this gate terminal.

Figure 5:
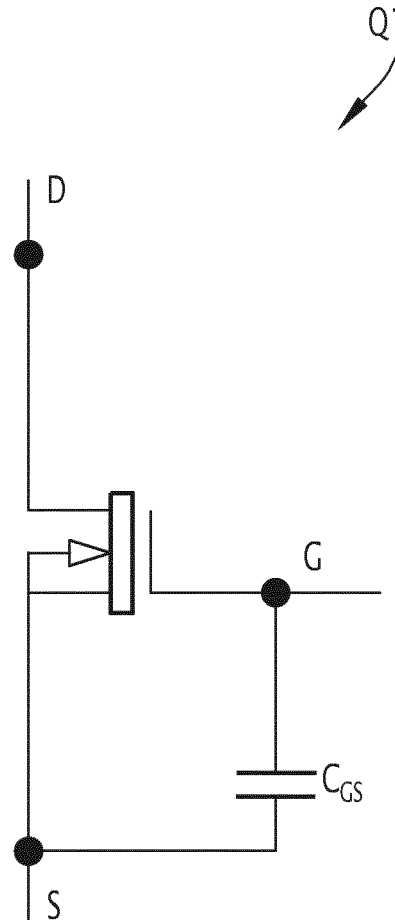
FIG. 5 is a detailed view of a portion of the electrical scheme of FIG. 4.

According to a particular example of the invention, each power transistor Q1A, Q1B is provided with a capacitor (not-shown on FIG. 4) connected between for example its gate terminal and its source terminal as it is shown on FIG. 5 in relation with the power transistor Q1A. Particularly, according to this figure, a capacitor $C_{GS}$ is provided between the gate terminal G and the source terminal S. This capacitor can be placed physically very close to the power transistor Q1A and can thus allow using of a wide range of transistors while ensuring good switching capacities. Indeed, disposing a real capacitor between a pair of terminals like gate and source terminals makes to provide a known response and some protection against parasitic capacitances generated by the transistor Q1A.

Each bias line LA, LB comprises a bias resistor R5A, R5B. Additionally, the bias line LA can be connected to the first battery terminal V⁺ via a transistor Q2. This transistor Q2 is used to switch on and switch off the power delivery (oscillation) and to control the power flow (PWM power control). The transistor Q2 can define a gate terminal which is connected to the transistor 01. Thus, when the transistor Q1 is controlled by the microcontroller 83, upon switching between ON/OFF states, the transistor Q1 powers the gate terminal of the transistor Q2 to also switch it between ON/OFF states. Each bias resistor R5A, R5B presents for example a Zener diode. The values of these bias resistors R5A, R5B are chosen to optimize the switching process carried out by the corresponding power transistors Q1A, Q1B.

Particularly, the values of the bias resistors R5A, R5B are chosen in a way to ensure proper timing of the switching of the corresponding power transistors Q1A, Q1B. Indeed, as it is known per se, there is a lag between the voltage given on the corresponding transistor and the voltage that is physically received by the transistor. This lag strongly depends on a time constant which is proportional to the resistance value of the corresponding resistor R5A, R5B. Therefore, the values for the resistors R5A, R5B are chosen in a way to "set" a proper lag value, which ensures proper switching (well-timed) to get clean sinusoidal signal. In a particular embodiment of the invention, the values for the resistors R5A, R5B can be chosen analytically by analysing the time needed to reach a given gate voltage ($V_{GS}$). This time can be modelled by the following expression:

$$t = R_G C_{iss} \times \ln\left(\frac{1}{1 - \frac{V_{gs}}{V_{GS}}}\right)$$

where:

$R_G$ is an effective gate resistance, i.e. the resistance value of the corresponding resistor R5A, R5B plus resistance of gate drive circuitry;

$C_{iss}$ an effective input capacitance of transistor (e.g. the resulting capacitance of the capacitor $C_{GS}$ in the example of FIG. 5);

$V_{gs}$ is the actual gate-source voltage and $V_{GS}$ is the maximum gate-source voltage (a voltage that the driver circuit sets or in this case is set notably by the oscillation circuit 76).

The voltage $V_{gs}$ can be modelled to find a time needed to reach a certain threshold (and adjust the values of R5A or R5B), using the following expression:

$$V_{gs} = V_{GS}\left(1 - e^{\frac{-t}{R_g \times (C_{gs} + C_{gd})}}\right)$$

In a particular example of the invention, the values for the resistors R5A, R5B are chosen by testing several values, starting for example from a value like 500 Ohm and ending for example with a value of 180 Ohm for both resistors, in order to optimize the switching points of the transistors Q1A, Q1B.

Referring to FIG. 4, the power circuit 82 further comprises two connection lines CLA, CLB and for each connection line CLA, CLB, a bypass line BLA, BLB connecting the gate terminal of one of the power transistors Q1A, Q1B to the corresponding connection line CLA, CLB. Each of the bias line LA, LB is connected for example to the corresponding bypass line BLA, BLB. Each connection line CLA, CLB connects one of terminals of a capacitor CH connected in parallel with the coil 72 to the second battery terminal V⁻.

Each connection line CLA, CLB comprises a diode D1A, D1B and a preventing resistor R34A, R34B to prevent negative voltage excursions on the corresponding power transistor Q1A, Q1B. Each diode D1 A, D1B and each preventing resistor R34A, R34B are connected in series between the corresponding bypass line BLA, BLB and the corresponding terminal of the capacitor CH.

Like for the bias resistors RSA, RSB, the values of the preventing resistors R34A, R34B are chosen basing on the parasitic capacitances of the corresponding transistors Q1A, Q1B in order to optimize the switching process. It is thus possible to use the previous expressions to estimate analytically these values. In a particular example of the invention, these values are chosen by testing several values. The retained value can for example be equal to 10 Ohm for both resistors.

One of the connection lines CLA, CLB, for example the connection line CLB, further comprises a potential divider 90 defining an output terminal T connected to the microcontroller 83. As shown on FIG. 4, the potential divider 90 is connected in series with the diode D1B and the preventing resistor R34B to the second battery terminal V⁻. Particularly, it can be connected between the corresponding bypass line BLA, BLB and the second battery terminal V⁻. In the example of FIG. 4, the other connection line CLA, i.e. connection line without the divider 90, comprises a load resistor R1A connected in parallel with the potential divider 90. In other words, the load resistor R1A is connected between the corresponding bypass line BLA and the second battery terminal V⁻. The resistance value of the resistor R1A is chosen as a trade-off between switching speed and capability of the circuit to be protected against unwanted turn-on in case when it is needed to be turned off. This resistance value is typically in the range of kOhm and can be for example be chosen substantially equal to 2,2 kOhm.

The potential divider 90 comprises two divider resistors R1B and R1C connected in series, the output terminal T being arranged between these resistors. The resistance values for these resistors R1B and R1C can be chosen in a way to ensure that the output voltage for the microcontroller 83 could be either 3,3 V or 5 V. As the voltage in the circuit is generally higher (greater than 8 V for example), the resistors R1B and R1 C are needed to bring the voltage down to a level acceptable by the microcontroller 83. Provided with such a divider 90, the microcontroller 83 is able to read switching edges and verify that the oscillation circuitry 76 has correctly started operation and is not held in a stable short conditions. For this purpose, the microcontroller 83 may monitor that the signal issued from the output terminal T of the potential divider 90 is consistent, i.e. that the switching between ON/OFF states happens in the same/comparable periods of time.

In one embodiment of the invention, the heating system 34 may further comprise a burst reservoir 93 connected to the battery 32B in parallel with the oscillation circuitry 76. As shown on FIG. 4, the burst reservoir 93 comprises at least two capacitors CDL2, CDL4 connected in parallel. The capacitors of the burst reservoir 93 are dimensioned so as to support the battery 32B with very high currents at the very beginning (for example several microseconds range) of the heating. This helps to start smoothly the heating by the heating system 34. Additionally, the burst reservoir 93 ensures high-resonant frequency (around 500 kHz) of providing current to the oscillation circuitry 76, especially in the very short moment when the transistors Q1A, Q1B are switching. In a general case, the total value of the capacitance for the burst reservoir can be chosen as 220 uF or smaller. The parallel connection of capacitors CDL2, CDL4 allows reduction of the resulting burst reservoir internal resistance, which helps to support the battery better. The resulting total capacity and internal resistance of the burst-reservoir is chosen depending on the battery (or battery pack) internal resistance and dynamic response. The lower its internal resistance, the less support is needed from this reservoir.

Figure 6:
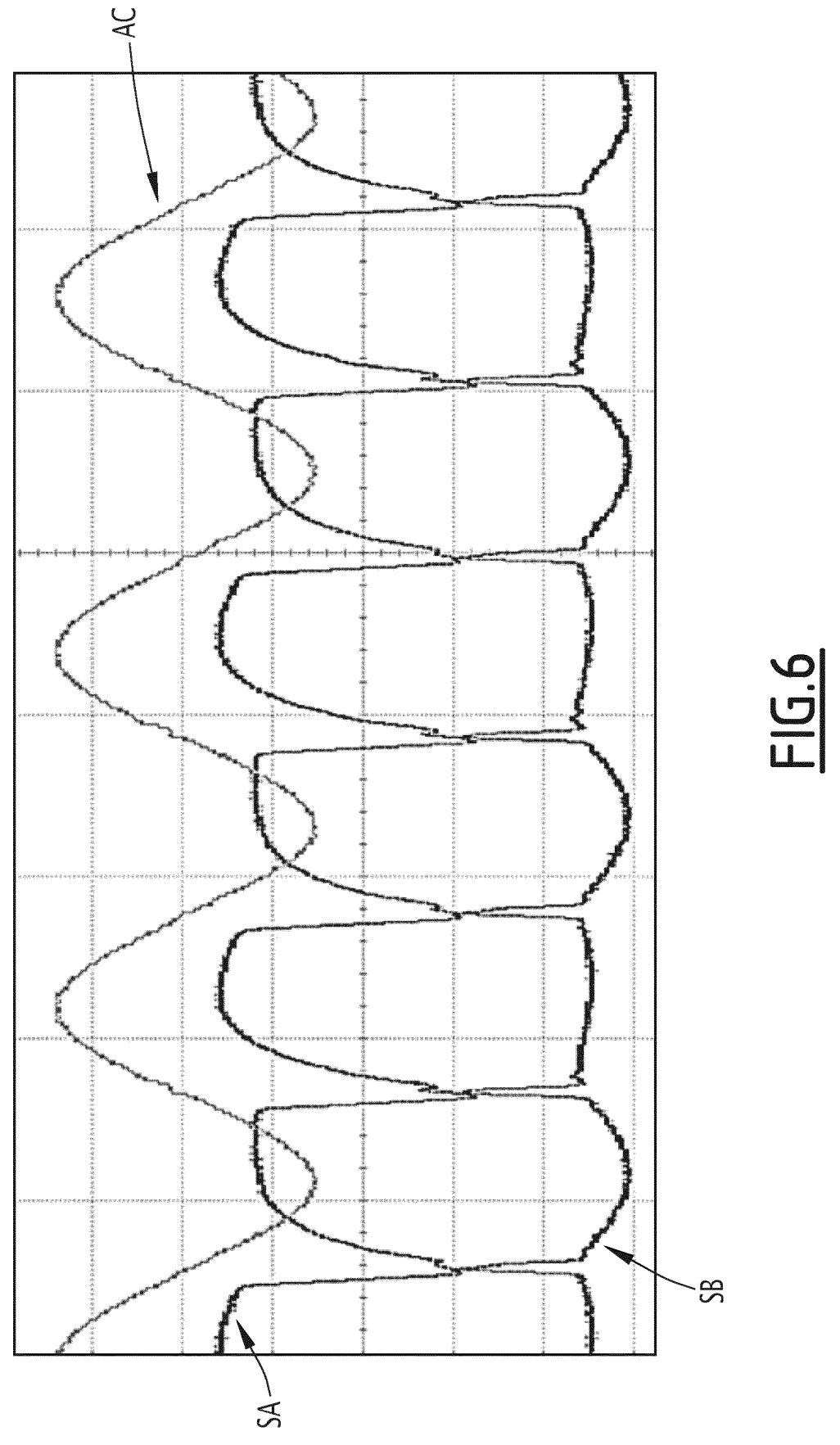
FIG. 6 is a schematic diagram illustrating the operation of the oscillation circuitry of FIG. 2.

FIG. 6 shows a result signal AC issued from the oscillation circuitry 76. As it can be seen, this signal presents a sinusoidal signal and forms a predetermined voltage profile used to power the coil 72. The result signal AC is composed of a first signal SA and as second signal SB, both signal being generated alternatively by by the power circuit 82.

The operation of the aerosol forming assembly 10 will now be explained. Initially, it is considered that the cartridge 14 is extracted from the aerosol generation device 12. The cartridge can be for example purchased separately from the aerosol generation device 12 and used as a consumable. When the user is intending to activate the operation of the assembly 10, he/she inserts first the cartridge 14 into the payload compartment 38 of the aerosol generation device 12. In this position, the coil 72 is arranged around the storage portion 66 of the cartridge 14 and the susceptor 74 is thus placed inside the coil 72. Then, the user activates the operation of the controller 36 by activating for example a switch or by making a puff. This activates the operation of the oscillation circuitry 76 and notably, the operation of the microcontroller 83. The power circuit 82 carries out a self-oscillating process to produce an alternative current AC on the coil 72. This process is monitored by the microcontroller 83 using the divider 90.. The coil 72 induces electric currents on the susceptor 74 which are transformed into heat. The heat is transferred to the precursor. This heat can be accurately controlled by controlling the AC current on the coil 72.

The invention claimed is:

1. A heating system for an aerosol generation assembly comprising a battery for providing DC current and a storage portion for storing a vaporizable material, the battery comprising a first battery terminal (V⁺) and a second battery terminal (V⁻);

the heating system comprising:
    a coil arranged in vicinity of the storage portion and connected to the first battery terminal (V⁺);
    a susceptor arranged in the storage portion;
    an oscillation circuitry configured to generate AC current on the coil from the DC current provided by the battery, the susceptor configured to heat the vaporizable material further to magnetic interaction with the coil;
wherein:
    the oscillation circuitry comprises at least one power circuit, the at least one power circuit comprising first and second power transistors (Q1A, Q1B) and a first bias line and a second bias line (LA, LB) for the first and second power transistors (Q1A, Q1B), respectively;
    each of the first and second power transistors (Q1A, Q1B) comprises a source terminal and a drain terminal connecting the coil to the second battery terminal (V⁻), and a gate terminal connected to the corresponding one of the first and second bias lines (LA, LB) and configured to control the current between the corresponding source and drain terminals according to the voltage on the corresponding gate terminal;
    the oscillation circuitry further comprises a microcontroller connected to the first and second bias lines (LA, LB) and configured to generate a voltage signal on each of the first and second bias lines (LA, LB); and
    the at least one power circuit further comprises a potential divider defining an output terminal (T) connected to the microcontroller, the microcontroller configured to verify an operation of the oscillation circuitry by analysing the voltage on the output terminal (T).

2. The heating system according to claim 1, wherein the first and second bias lines (LA, LB) comprises a first bias resistor and a second bias resistor (R5A, R5B), respectively.

3. The heating system according to claim 1, wherein the oscillation circuitry further comprises a capacitor (CH) connected in parallel with the coil and comprising first and second capacitor terminals.

4. The heating system according to claim 3, wherein the at least one power circuit further comprises first and second connection lines (CLA, CLB) connecting the first and second capacitor terminals, respectively, to the second battery terminal (V⁻) and for the first and second connection lines (CLA, CLB), a first bypass line and a second bypass line (BLA, BLB), respectively, connecting the gate terminals of the first and second power transistors (Q1A, Q1B), respectively, to the corresponding first and second connection lines (CLA, CLB).

5. The heating system according to claim 4, wherein the first and second connection lines (CLA, CLB) comprises a first diode and a second diode (D1A, D1B), respectively, and a first preventing resistor and a second preventing resistor (R34A, R34B), respectively, connected in series between the corresponding one of the first and second bypass lines and the corresponding one of the first and second capacitor terminals to prevent negative voltage excursions on the corresponding one of the first and second power transistor (Q1A, Q1B).

6. The heating system according to claim 4, wherein the potential divider is integrated into one of the first and second connection lines (CLA, CLB) between the second battery terminal (V⁻) and the corresponding one of the first and second bypass lines (BLA, BLB).

7. The heating system according to claim 6, wherein other of the first and second connection lines (CLA, CLB) without the potential divider further comprises a load resistor (R1A)

connected between the corresponding one of the first and second bypass lines (BLA, BLB) and the second battery terminal (V⁻).

8. The heating system according to claim 1, wherein the at least one power circuit further comprises for each of the first and second power transistors (Q1A, Q1B), a capacitor connected between a pair of terminals of the corresponding power transistor (Q1A, Q1B).

9. The heating system according to claim 8, wherein said pair of terminals are source and gate terminals.

10. The heating system according to claim 1, wherein the coil is configured to be powered by a sinusoidal signal.

11. The heating system according to claim 1, wherein the coil is arranged around the storage portion.

12. The heating system according to claim 1, further comprising a burst reservoir connected to the battery in parallel with the oscillation circuitry and comprising at least first and second capacitors (CDL2, CDL4) connected in parallel.

13. An aerosol generation assembly comprising a heating system according to claim 1.

14. The aerosol generation assembly according to claim 13, further comprising an aerosol generation device and a cartridge, the battery arranged in the aerosol generation device and the storage portion arranged in the cartridge.

15. The aerosol generation assembly according to claim 14, wherein the coil and the oscillation circuitry are arranged in the aerosol generation device.

*    *    *    *    *